(12) United States Patent
Jang et al.

(10) Patent No.: US 12,164,192 B2
(45) Date of Patent: Dec. 10, 2024

(54) DISPLAY DEVICE

(71) Applicant: SAMSUNG ELECTRONICS CO., LTD., Suwon-si (KR)

(72) Inventors: Naewon Jang, Suwon-si (KR); Youngchol Lee, Suwon-si (KR); Hyungsuk Kim, Suwon-si (KR); Seokwoo Yong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/120,560

(22) Filed: Mar. 13, 2023

(65) Prior Publication Data

US 2023/0213813 A1   Jul. 6, 2023

Related U.S. Application Data

(63) Continuation of application No. PCT/KR2021/012397, filed on Sep. 13, 2021.

(30) Foreign Application Priority Data

Oct. 20, 2020   (KR) .................... 10-2020-0136017

(51) Int. Cl.
*G02F 1/13357*   (2006.01)
*H01L 33/10*   (2010.01)
(Continued)

(52) U.S. Cl.
CPC .. *G02F 1/133603* (2013.01); *G02F 1/133605* (2013.01); *H01L 33/10* (2013.01);
(Continued)

(58) Field of Classification Search
CPC .. G02F 1/133615; H01L 33/10; H01L 33/502
See application file for complete search history.

(56) References Cited

U.S. PATENT DOCUMENTS

| 9,366,398 B2 | 6/2016 | Jang et al. |
| 9,885,820 B2 | 2/2018 | Kim et al. |

(Continued)

FOREIGN PATENT DOCUMENTS

| JP | 2009-295501 | 12/2009 |
| JP | 2014-235891 | 12/2014 |

(Continued)

OTHER PUBLICATIONS

International Search Report dated Jan. 3, 2022 in PCT/KR2021/012397.

(Continued)

*Primary Examiner* — Eric T Eide
(74) *Attorney, Agent, or Firm* — Nixon & Vanderhye, P.C.

(57) ABSTRACT

An example display apparatus includes a liquid crystal panel; a light source plate including a printed circuit board disposed behind the liquid crystal panel, and a light source module mounted on the printed circuit board to supply light to the liquid crystal panel. The light source module includes a light emitting diode (LED) chip; a light guide provided to guide the light emitted from the LED chip; a light converter provided to convert a wavelength of light guided through the light guide, and disposed on a first surface of the light guide and attached to the printed circuit board; and a distributed Bragg reflector (DBR) layer disposed on a second surface of the light guide body and provided to improve a light conversion efficiency of the light conversion member.

17 Claims, 8 Drawing Sheets

(51) Int. Cl.
*H01L 33/50* (2010.01)
*H01L 33/56* (2010.01)
*H01L 33/64* (2010.01)

(52) U.S. Cl.
CPC ............ *H01L 33/502* (2013.01); *H01L 33/56* (2013.01); *H01L 33/644* (2013.01)

(56) References Cited

U.S. PATENT DOCUMENTS

| | | | |
|---|---|---|---|
| 9,909,062 | B2 | 3/2018 | Dubrow et al. |
| 9,971,085 | B2 | 5/2018 | Seo et al. |
| 10,288,939 | B2 | 5/2019 | Wang et al. |
| 10,784,415 | B2 | 9/2020 | Jung et al. |
| 10,948,163 | B2 | 3/2021 | Lee |
| 11,472,979 | B2 | 10/2022 | Linton et al. |
| 11,709,397 | B2 * | 7/2023 | Allen ................. G02F 1/133605 349/64 |
| 2015/0062490 | A1 * | 3/2015 | Kwon .................. G02B 6/0068 349/64 |
| 2017/0345983 | A1 * | 11/2017 | Hsieh .................... H01L 33/502 |
| 2018/0358520 | A1 * | 12/2018 | Moon ..................... H01L 33/60 |
| 2019/0011780 | A1 * | 1/2019 | Wang ................ G02F 1/133603 |
| 2019/0058095 | A1 * | 2/2019 | Choi ....................... H01L 33/56 |
| 2019/0278013 | A1 * | 9/2019 | Huang ................. G02B 6/0023 |
| 2019/0293970 | A1 | 9/2019 | Kim et al. |
| 2020/0300444 | A1 * | 9/2020 | Lee ....................... H01L 33/505 |
| 2020/0309346 | A1 * | 10/2020 | Iwasa ..................... H01L 33/501 |
| 2020/0335660 | A1 * | 10/2020 | Kang ....................... H05K 1/185 |
| 2021/0119087 | A1 * | 4/2021 | Kim ........................ H01L 33/58 |

FOREIGN PATENT DOCUMENTS

| | | |
|---|---|---|
| JP | 2019-160787 | 9/2019 |
| JP | 2020-506496 | 2/2020 |
| JP | 6708967 | 6/2020 |
| KR | 10-2012-0088273 | 8/2012 |
| KR | 10-2013-0083807 | 7/2013 |
| KR | 10-1312238 | 9/2013 |
| KR | 10-1348565 | 1/2014 |
| KR | 10-2015-0062729 | 6/2015 |
| KR | 10-2015-0092810 | 8/2015 |
| KR | 10-2015-0123086 | 11/2015 |
| KR | 10-1567903 | 11/2015 |
| KR | 10-1567927 | 11/2015 |
| KR | 10-1619452 | 5/2016 |
| KR | 10-2017-0036821 | 4/2017 |
| KR | 10-1855991 | 5/2018 |
| KR | 10-2019-0068657 | 6/2019 |
| KR | 10-2019-0090332 | 8/2019 |
| KR | 10-2041247 | 11/2019 |
| WO | 2018/129909 | 7/2018 |
| WO | 2020/223098 | 11/2020 |

OTHER PUBLICATIONS

Written Opinion dated Jan. 3, 2021 in PCT/KR2021/012397.
Office Action dated Aug. 5, 2024 in Korean Patent Application No. 10-2020-0136017 and English-language translation.

* cited by examiner

DISPLAY DEVICE

CROSS-REFERENCE TO RELATED APPLICATIONS

This application is a continuation of International Patent Application No. PCT/KR2021/012397 designating the United States, filed on Sep. 13, 2021, in the Korean Intellectual Property Receiving Office, and claiming priority to Korean Patent Application No. 10-2020-0136017, filed on Oct. 20, 2020, in the Korean Intellectual Property Office. The disclosures of each of these applications are incorporated by reference herein in their entireties.

BACKGROUND

Field

The disclosure relates to a display apparatus including a backlight unit.

Description of Related Art

A display apparatus is a type of output device that visually displays data information such as text or figures, and images and includes, for example and without limitation, a television, various monitors, and various portable terminals (e.g., notebook computer, tablet PC and smart phone).

The display apparatus is classified into a light-emitting type using a display panel that emits light by itself, and a light-receiving type using a display panel that needs to receive light from a separate light source such as a backlight unit. The light-emitting panel includes, for example, an organic light-emitting diode (OLED), and the light-receiving panel includes, for example, a liquid crystal display (LCD).

According to a location of the light source, the backlight unit is classified into a direct type in which the light source is disposed at the rear of the display panel and an edge type in which the light source is disposed at the lateral side of the display panel. The direct type of the backlight unit includes, for example, a light source plate in which a Light Emitting Diode (LED) is mounted on a flat printed circuit board.

Recently, a display apparatus may include a lens provided to cover a light source to widen an optical diffusion area of light emitted from the light source. However, due to the expansion of the optical diffusion area through the lens, a number of local dimming blocks is reduced, which causes a limitation in improving the contrast ratio.

In addition, the display apparatus may improve color reproducibility of light emitted from the light source through quantum dots (QDs). Conventionally, the improvement of the color reproducibility has been implemented through a quantum dot sheet (QD sheet) provided at the rear of the display panel, and due to the quantum dot sheet, the thickness of the display apparatus may be increased.

SUMMARY

According to various example embodiments, a display apparatus capable of increasing the number of local dimming blocks and improving a contrast ratio by improving a structure is provided.

Further, according to various example embodiments, a display apparatus capable of reducing a thickness and increasing a lifespan of a quantum dot conversion member by improving a structure is provided.

Further, according to various example embodiments, a display apparatus capable of maintaining color reproducibility while reducing an amount of a quantum dot conversion member in comparison with a quantum dot sheet is provided.

According to various example embodiments, a display apparatus may include a liquid crystal panel, a light source plate including a printed circuit board disposed behind the liquid crystal panel, and a light source module mounted on the printed circuit board to supply light to the liquid crystal panel. The light source module includes a light emitting diode (LED) chip, a light guide body (e.g., a light guide) provided to guide the light emitted from the LED chip, a light conversion member (e.g., a light converter) provided to convert a wavelength of light guided through the light guide body, and disposed on one surface of the light guide body and attached to the printed circuit board, and a distributed Bragg reflector (DBR) layer disposed on the other surface of the light guide body and provided to improve a light conversion efficiency of the light conversion member.

The light conversion member may include a quantum dot particle provided to convert a wavelength of light emitted from the light source module.

The light conversion member may be disposed on a rear surface of the light guide body, and the DBR layer may be disposed on a front surface of the light guide body.

The light source module may include a plurality of light source modules.

Light emitted from the LED chip may be incident on an inside of the light guide body through an incident surface of the light guide body on which the light conversion member and the DBR layer are not disposed.

The LED chip may be configured to emit blue-based light. The light conversion member may include a red quantum dot configured to convert blue-based light into red-based light and a green quantum dot configured to convert blue-based light into green-based light.

The light source module may further include a transparent resin provided to cover the light guide body, the light conversion member, and the DBR layer.

The transparent resin may be provided in a dome shape on the printed circuit board.

The light conversion member may be formed in an embossed shape on the rear surface of the light guide body.

The light guide body may include a receiving groove formed in an engraved shape on the rear surface of the light guide body, and the light conversion member may be inserted into the receiving groove.

The light source module may further include a light blocking member provided to surround the light guide body to prevent light loss.

The light blocking member may cover remaining surfaces of the light guide body except for the front surface, the rear surface, and the incident surface of the light guide body.

The light source module may include an adhesive layer disposed between the printed circuit board and the light conversion member so as to attach the light conversion member to the printed circuit board.

Heat generated in the light source module may be dissipated to the printed circuit board.

The light guide body may protect the light conversion member from direct light emitted from the LED chip.

According to example embodiments, a display apparatus may include a liquid crystal panel, a printed circuit board disposed in parallel with the liquid crystal panel, a light emitting diode (LED) chip mounted on the printed circuit board, a light guide body (e.g., a light guide) disposed on the printed circuit board so as to guide the light emitted from the LED chip toward the liquid crystal panel, and a light conversion member (e.g., a light converter) provided to convert a wavelength of the light emitted from the LED chip. The light conversion member is attached to the printed circuit board to dissipate heat generated from the light conversion member, and the light conversion member is covered by the light guide body to be protected from direct light emitted from the LED chip.

The light conversion member may include a quantum dot particle provided to convert a wavelength of light emitted from the LED chip.

The light guide body may include an exit surface through which light is emitted to the liquid crystal panel. The light guide body may further include a distributed Bragg reflector (DBR) layer disposed on the exit surface and provided to reflect short-wavelength light and transmit long-wavelength light among light emitted from the exit surface.

According to example embodiments, a display apparatus may include a liquid crystal panel, a printed circuit board disposed behind the liquid crystal panel, a plurality of light emitting devices mounted on the printed circuit board and including a light emitting surface provided to emit light in a direction perpendicular to a front and rear direction, a plurality of optical structures disposed on the printed circuit board to cover the light emitting surface of each of the plurality of light emitting devices, the plurality of optical structures provided to guide light emitted from each of the plurality of light emitting devices to the liquid crystal panel, and a plurality of transparent resin domes provided to surround each of the plurality of light emitting devices and each of the plurality of optical structures corresponding to the each of the light emitting devices. Each of the plurality of optical structures may include a light guide body (e.g., a light guide), a light conversion pattern patterned on one surface of the light guide body and provided to convert a wavelength of light emitted from the light emitting device, and a distributed Bragg reflector (DBR) layer disposed on the other surface of the light guide body and provided to improve a light conversion efficiency of the light conversion pattern.

The light conversion pattern may include a quantum dot particle provided to convert a wavelength of light emitted from the light source module.

According to various example embodiments, a display apparatus may increase the number of local dimming blocks and improve a contrast ratio by improving a structure.

According to various example embodiments, a display apparatus may maintain color reproducibility while reducing an amount of a quantum dot conversion member in comparison with a quantum dot sheet.

According to various example embodiments, a display apparatus may not require an additional quantum dot sheet because an optical structure including quantum dots to improve color reproducibility is provided on a light source plate. Therefore, it is possible to make the display apparatus slim.

Heat generated in a light conversion member including quantum dots may be dissipated through a printed circuit board, and the light conversion member may be protected from direct light emitted from a light emitting diode (LED) chip. Accordingly, a lifespan of the light conversion member and a display apparatus may be increased.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Embodiments described in the disclosure and configurations shown in the drawings are merely examples of the embodiments of the disclosure, and may be modified in various different ways to replace the embodiments and drawings of the disclosure.

In addition, the same reference numerals or signs shown in the drawings of the disclosure indicate elements or components performing substantially the same function.

Also, the terms used herein are used to describe the example embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof. Shapes and sizes of elements in the drawings may be exaggerated for clear description.

It will be understood that, although the terms first, second, third, etc., may be used herein to describe various elements, such elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

The directions of "upper", "lower", "front", "rear", and the like may be defined by the drawings, but the shape and the location of the component is not limited by the term. In the drawings, X-axis, Y-axis, and Z-axis directions perpendicular to each other are indicated, the X-axis direction may refer, for example, to a left and right direction along a direction of a long side 11 of a liquid crystal panel 10, and the Y-axis direction may refer, for example, to an up and down direction along a short side 12 of the liquid crystal panel 10, and the Z-axis direction may refer, for example, to a front and rear direction.

Hereinafter example embodiments according to the disclosure will be described in detail with reference to the accompanying drawings.

Figure 1:
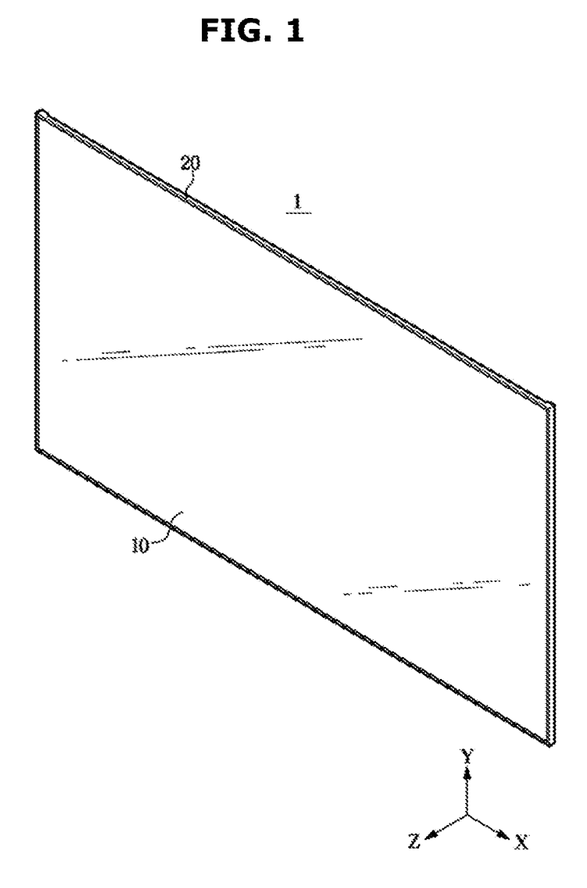
FIG. 1 is a diagram illustrating perspective view of an example display apparatus according to various embodiments.
Figure 2:
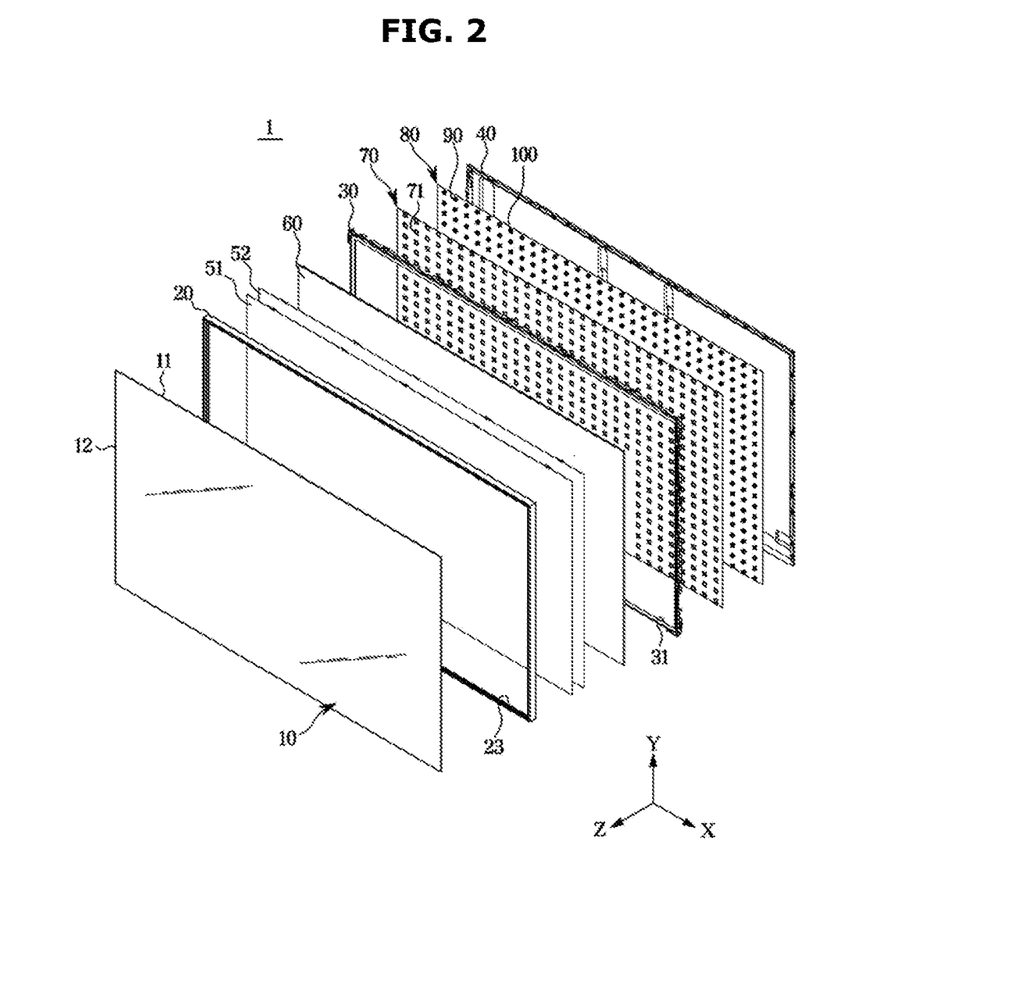
FIG. 2 is a diagram illustrating an exploded perspective view of the example display apparatus shown in FIG. 1.
Figure 3:
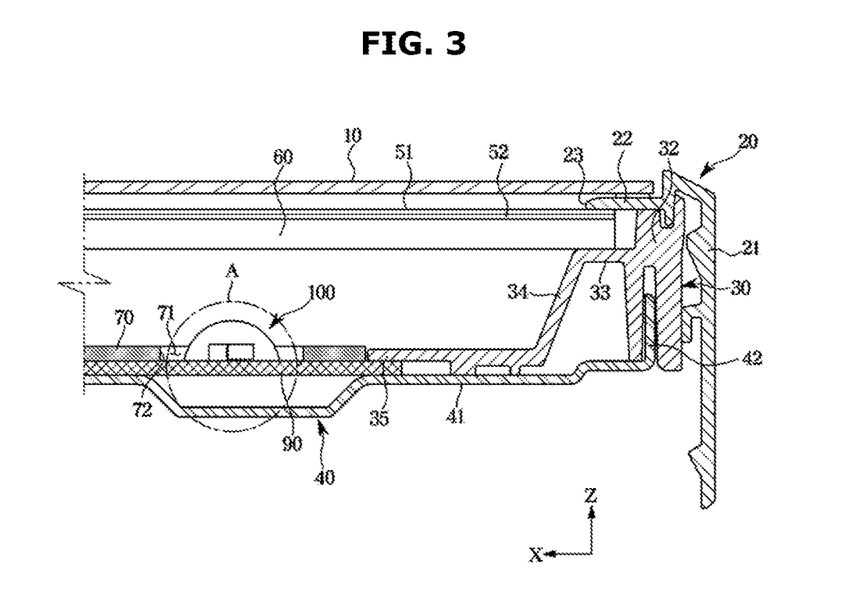
FIG. 3 is a diagram illustrating a cross-sectional view of the example display apparatus shown in FIG. 1.

FIG. 1 is a diagram illustrating a perspective view of an example display apparatus according to various embodiments. FIG. 2 is a diagram illustrating an exploded perspective view of the example display apparatus shown in FIG. 1. FIG. 3 is a diagram illustrating a cross-sectional view of the example display apparatus shown in FIG. 1.

Referring FIGS. 1, 2 and 3, a display apparatus 1 may include the liquid crystal panel 10 provided to display an image, a backlight unit (e.g., including a backlight) disposed behind the liquid crystal panel 10 to supply light to the liquid crystal panel 10, and a chassis assembly provided to support the backlight unit and the liquid crystal panel 10.

The chassis assembly may include a rear chassis 40 provided to support the backlight unit, a front chassis 20 provided in front of the rear chassis 40 to support the liquid crystal panel 10, and a middle mold 30 coupled between the front chassis 20 and the rear chassis 40.

The liquid crystal panel 10 may include a thin film transistor substrate on which a thin film transistor is formed in a matrix, a color filter substrate coupled to the thin film transistor substrate side by side, and a liquid crystal injected between the thin film transistor substrate and the color filter substrate. The liquid crystal may have different optical properties according to changes in voltage or temperature.

The backlight unit may be disposed at the rear of the liquid crystal panel 10 to illuminate the liquid crystal panel 10. The backlight unit may include a light source plate 80 including a printed circuit board 90 on which a plurality of light source modules 100 is mounted, and optical members disposed on a movement path of light emitted from the light source plate 80.

The light source plate 80 may have a flat shape. The light source plate 80 may be disposed in parallel to the liquid crystal panel 10.

The light source plate 80 may include the printed circuit board 90 and the plurality of light source modules 100 mounted on a surface, facing the liquid crystal panel 10, of the printed circuit board 90. The light source modules 100 will be described later.

The optical members may be disposed on the movement path of the light emitted from the light source modules 100 to guide a traveling direction of light, reflect the light, diffuse the light, and/or improve optical characteristics of the light.

The optical members may include a reflector sheet 70 reflecting light to prevent light loss, a diffuser plate 60 evenly diffusing irregular light emitted from the light source plate 80, and optical sheets 51 and 52 improving optical characteristics.

The reflector sheet 70 may reflect the light, which is emitted from the light source plate 80, or the light, which is emitted from the diffuser plate 60 to the rear side, to the diffuser plate 60. The reflector sheet 70 may be disposed in the front side of the light source plate 80 to be in close contact with the light source plate 80.

The reflector sheet 70 may include a plurality of openings 71 formed to correspond to the plurality of light source modules 100. Each of the plurality of light source modules 100 may be disposed inside a corresponding opening 71. Each of the plurality of light source modules 100 may be spaced apart from an inner circumferential surface 72 of the corresponding opening 71. Due to this arrangement structure, the light emitted from the plurality of light source modules 100 may be prevented from being blocked by the inner circumferential surface 72 of the opening 71 and a beam angle thereof may be increased.

The opening 71 of the reflector sheet 70 may be formed, for example, in a square shape or a circular shape.

The diffuser plate 60 may evenly diffuse the light emitted from the light source plate 80 and support the optical sheets 51 and 52. The diffuser plate 60 may evenly diffuse the light incident on an incident surface and emit the light to an exit surface.

The optical sheets 51 and 52 may be disposed in front of the diffuser plate 60 to improve optical characteristics of the light emitted from the diffuser plate 60. The optical sheets 51 and 52 may include, for example, a diffuser sheet provided to cancel the pattern of the diffuser plate 60 and a prism sheet provided to improve luminance by concentrating light. In addition, the optical sheets 51 and 52 may include a protection sheet provided to protect the other optical sheet(s) from external impact or an introduction of foreign matter, and a Dual Brightness Enhancement Film (DBEF) provided to improve luminance by transmitting one polarized beam and by reflecting the other polarized beam.

The rear chassis 40 may be disposed at the rear of the backlight unit. The rear chassis 40 may have a plate shape in which an edge portion is bent forward. The backlight unit may be accommodated between the rear chassis 40 and the front chassis 20.

The rear chassis 40 may include a rear base 41 on which the light source plate 80 is installed, and a rear lateral side 42 formed on upper, lower, left, and right edges of the rear chassis 40 so as to be coupled to the middle mold 30.

The rear chassis 40 may function to dissipate the heat generated from a heating element, such as the plurality of light source modules 100, to an outside. For this, the rear chassis 40 may be formed of a metal material such as aluminum or SUS, or a plastic material such as ABS.

The front chassis 20 may have a frame shape including an opening 23 to allow the light of the backlight unit to be supplied to the liquid crystal panel 10. The front chassis 20 may include a front lateral side 21 formed at upper, lower, left, and right edges of the front chassis 20 so as to be coupled to the middle mold 30, and a panel support 22 protruding inwardly from the front lateral side 21 so as to support the liquid crystal panel 10.

The middle mold 30 may support the diffuser plate 60 and reflect the light, which is emitted from the light source plate 80, to the diffuser plate 60. The middle mold 30 may maintain a gap between the diffuser plate 60 and the light source plate 80. The middle mold 30 may be coupled between the front chassis 20 and the rear chassis 40.

The middle mold 30 may be formed in a frame shape including an opening 31. The middle mold 30 may include a frame 32 to which the front chassis 20 and the rear chassis 40 are coupled, a diffuser plate support 33 protruding inwardly from the frame 32 to support the diffuser plate 60, a reflector 34 extending from the diffuser plate support 33 to reflect the light, and a substrate support 35 extending from the reflector 34 to support the printed circuit board 90.

The frame 32 may be formed at the upper, lower, left, and right edges of the middle mold 30. The frame 32 may be coupled to the front chassis 20 and the rear chassis 40 using various known fitting structures and separate fastening members.

The diffuser plate support 33 may protrude inwardly from the frame 32 to support the diffuser plate 60. The diffuser plate support 33 may support an edge of an (light) incident surface of the diffuser plate 60. The diffuser plate support 33 may be formed in parallel to the base 41 of the rear chassis 40.

The reflector 34 may reflect light emitted from the light source plate 80 to the incident surface of the diffuser plate 60. The reflector 34 may extend substantially in an inwardly inclined manner from the diffuser plate support 33. The reflector 34 may extend in an inclined manner from the diffuser plate support 33 toward the substrate support 35.

The substrate support 35 may fix the printed circuit board 90 of the light source plate 80 to prevent the printed circuit board 90 from being lifted from the base 41 of the rear chassis 40. The substrate support 35 may be formed at an inner end of the reflector 34. An edge of the printed circuit board 90 of the light source plate 80 may be supported between the substrate support 35 and the base 41.

The frame 32, the diffuser plate support 33, the reflector 34, and the substrate support 35 of the middle mold 30 may be integrally formed. A highly reflective material may be coated on a surface of the middle mold 30. The highly reflective material may be coated on the entire surface of the middle mold 30 or only on the surface of the reflector 34. The entire middle mold 30 or the reflector 34 of the middle mold 30 may have a white color to allow light to be reflected well.

The printed circuit board 90 of the light source plate 80 may include a base, a power wiring layer including a metal wiring and an insulation layer formed between the base and the power wiring layer and disposed on the front side of the base and disposed at the rear of the power wiring layer, and a photo solder resist (PSR) layer formed on the front side of the power wiring layer to be exposed to the outside so as to protect a pattern of the power wiring layer and to increase a light efficiency.

The base may serve to form a skeleton of the light source plate 80, and any substrate capable of applying a voltage to a light emitting device 110 (refer to FIG. 4) through the power wiring layer may be used. For example, the base may be formed of a material such as FR-4, ceramic, polyimide, PET, or glass.

The metal wiring of the power wiring layer may be formed, for example, by patterning a conductive material on the base.

The insulating layer may be disposed between the base and the power wiring layer to electrically insulate the base and the metal wiring of the power wiring layer.

The PSR layer may be formed by applying a photo solder resist (PSR) ink on the power wiring layer.

The plurality of light source modules 100 may be mounted on the printed circuit board 90.

Figure 4:
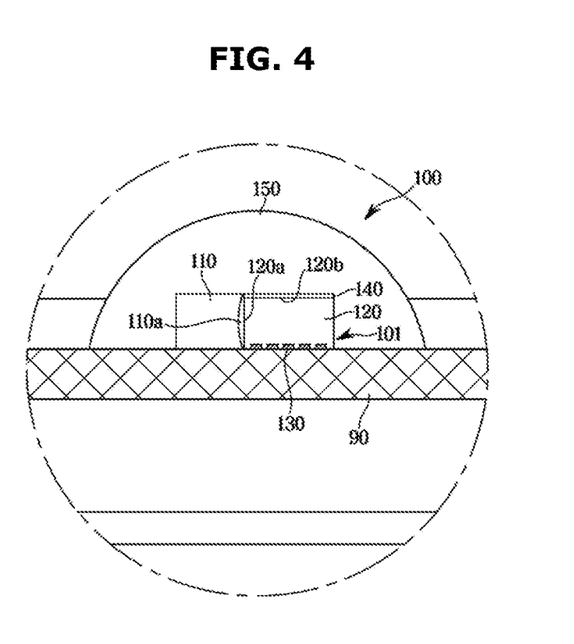
FIG. 4 is a diagram illustrating an enlarged view of part A of FIG. 3.
Figure 5:
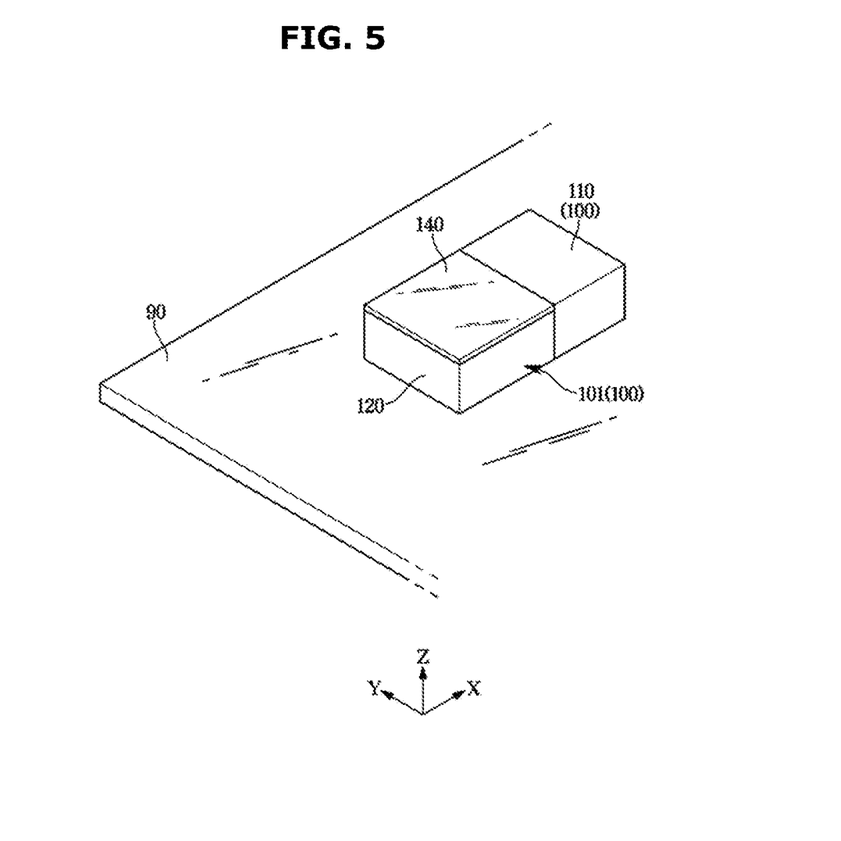
FIG. 5 is a diagram illustrating a view of an arrangement of an optical structure and a light emitting device shown in FIG. 4 according to various embodiments.
Figure 6:
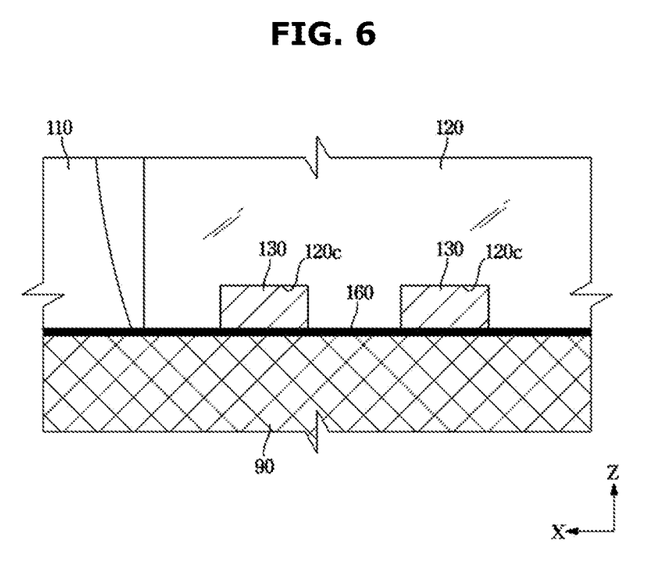
FIG. 6 is a diagram illustrating a view of a state in which a light conversion member is formed in the optical structure shown in FIG. 4 according to various embodiments.
Figure 7:
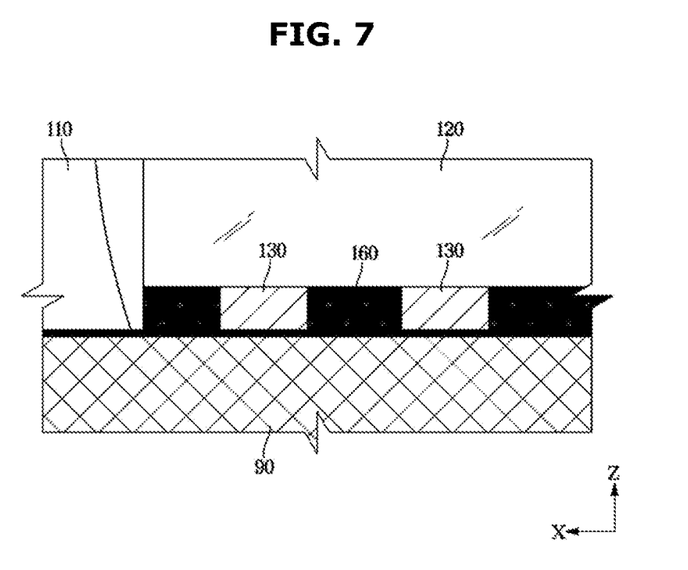
FIG. 7 is a diagram illustrating a view of a state in which a light conversion member is formed in an optical structure according to various embodiments.

FIG. 4 is a diagram illustrating an enlarged view of part A of FIG. 3. FIG. 5 is a diagram illustrating a view of an arrangement of an optical structure and a light emitting device shown in FIG. 4. FIG. 6 is a diagram illustrating a view of a state in which a light conversion member is formed in the optical structure shown in FIG. 4 according to various embodiments. FIG. 7 is a diagram illustrating a view of a state in which a light conversion member is formed in an optical structure according to various embodiments.

The structure of the light source module 100 will be described in detail with reference to FIGS. 4, 5, 6, and 7.

Each of the plurality of light source modules 100 may include the light emitting device 110 configured to generate light and a plurality of optical structures 101 provided to guide light emitted from the light emitting device 110 to the liquid crystal panel 10. Each of the optical structures 101 may be provided to correspond to each of the light emitting devices 110.

The light emitting device 110 may include, for example, a light emitting diode (LED) chip. That is, the light emitting device 110 may include the LED chip configured to emit light and an additional optical member such as a reflector. Alternatively, the light emitting device 110 may include only the LED chip. Therefore, the light emitting element and the LED chip may be described using the same reference numerals.

The light emitting device 110 may include a light emitting surface 110a from which light is emitted in a direction perpendicular to the front and rear direction. The LED chip may emit light in a direction perpendicular to the front and rear direction. The optical structure 101 may cover the light emitting surface 110a. The optical structure 101 may be provided in such a way that an incident surface 120a of the optical structure faces the light emitting surface 110a.

The plurality of light source modules 100 may be mounted to have a predetermined distance from each other. A plurality of light emitting devices 110 may be mounted to have a predetermined distance from each other. The plurality of light source modules 100 may be mounted in a matrix form on the printed circuit board 90. The plurality of light emitting devices 110 may be mounted in a matrix form on the printed circuit board 90. Each of the plurality of light emitting devices 110 may have the same configuration.

The LED chip included in the light emitting device 110 may be a mini-LED having a size of hundreds of μm or a micro-LED having a size of several μm to several tens of μm, as well as a LED having a general size.

The LED chip of the light emitting device 110 may be configured to emit blue-based light. The LED chip 110 may be provided as at least one of a blue QD electroluminescent element, a blue fluorescent electroluminescent element, a blue thermally activated delayed fluorescent electroluminescent element, and/or a blue phosphorescent electroluminescent element.

The LED chip of the light emitting device 110 may be directly mounted on the printed circuit board 90 in a Chip On Board (COB) method. However, the method is not limited thereto. The LED chip may be mounted using a Surface Mounting Technology (SMT) method rather than the COB method.

According to various example embodiments, it is possible to include a large number of LED chips in comparison with a light source plate including a lens in the conventional manner. In comparison with the conventional manner, a distance between the plurality of LED chips 110 may be reduced, and accordingly, the number of LED chips mounted on the same area may be greatly increased. Local dimming refers to a function of turning on/off some LED chips among the plurality of LED chips. Accordingly, when expressing a black color that does not require a backlight, a black color that is close to reality may be implemented by turning off some LED chips. Each of the plurality of LED chips may form one local dimming block. Accordingly, when the number of LED chips increases, the number of local dimming blocks increases. When the number of local dimming blocks increases, the contrast ratio may be improved. Accordingly, according to various example embodiments, the number of local dimming blocks of the display apparatus may be increased and the contrast ratio may be improved.

The LED chip 110 may be an inorganic light emitting element. The inorganic light emitting element may be manufactured by growing an inorganic material as a thin film on a sapphire, gallium arsenide (GaAs), or silicon (Si)-based base substrate. The inorganic materials may be aluminum (AL), gallium (Ga), nitrogen (N), phosphorus (P), arsenic (As), or indium (In).

The LED chip 110 may be picked up from the base substrate and directly transferred to the printed circuit board 90. The LED chip 110 may be picked up and transferred using an electrostatic method using an electrostatic head or an adhesive method using an elastic polymer material, such as PDMS or silicon, as a head.

Each of the plurality of light source modules 100 may include a transparent resin 150 formed to surround the light emitting device 110 and the optical structure 101 corresponding to the light emitting device 110. The transparent resin 150 may include a plurality of transparent resins 150. The transparent resin 150 may protect the light emitting device 110 and the optical structure 101, and increase light efficiency.

The transparent resin 150 may be formed by dispensing a liquid molding material to enclose the light emitting device 110 and the corresponding optical structure 101, and then curing the liquid molding material. The transparent resin 150 may be silicone or epoxy resin, and when the silicone or epoxy resin is dispensed on the light emitting device 110 and the corresponding optical structure 101, the silicone or epoxy resin may spread by gravity to surround the light emitting device 110 and the corresponding optical structure 101. Accordingly, the transparent resin 150 may have a substantially dome shape and may be fixed on the printed circuit board 90.

Because the transparent resin 150 is provided in a dome shape on the light emitting device 110 and the corresponding optical structure 101, it is possible to widen the beam angle of light emitted toward the liquid crystal panel 10.

Hereinafter the plurality of optical structures 101 will be described in detail.

In order to improve color reproducibility of light emitted from a light source, a display apparatus in the conventional manner includes a quantum dot sheet for changing a wavelength of light emitted from the light source.

A quantum dot sheet is disposed at a predetermined distance from the light source inside the display apparatus to prevent thermal deformation caused by heat generated from the light source, and the quantum dot sheet is disposed with an additional protective film to prevent penetration of moisture from the outside.

As a result, the color reproducibility of the display apparatus is improved and the performance of the display apparatus is improved. However, due to the arrangement of the quantum dot sheet inside the display apparatus, a thickness of the display apparatus increases, and the production cost caused by the quantum dot sheet and the protective film of the quantum dot sheet increases.

To alleviate the increase in the production cost, a display apparatus including a light source, in which a configuration including quantum dots is directly installed on an LED package instead of a quantum dot sheet, has been developed. However, the configuration including quantum dots is installed on the LED package, and thus the reliability of the configuration including quantum dots may be reduced caused by heat generated by the LED chip and the external moisture.

In order to relieve the above difficulty, the display apparatus 1 according to an embodiment may include a configuration that is configured to improve reliability against heat and moisture of a component including quantum dots without a quantum dot sheet, and that is configured to increase a life span of the component including quantum dots.

Particularly, the light source plate 80 may include the plurality of optical structures 101 provided to correspond to the plurality of light emitting devices 110. The optical structure 101 may be disposed on the printed circuit board 90. The optical structure 101 may be attached on the printed circuit board 90 by an adhesive layer 160 formed by an adhesive. The type of adhesive is not limited.

The plurality of optical structures 101 may be provided to cover the light emitting surfaces 110a of the plurality of light emitting devices 110. Because the light emitting device 110 emits light in a direction perpendicular to the front and rear direction, such as the up and down direction or the left and right direction, the optical structure 101 may be disposed in parallel with the light emitting device 110 to allow the incident surface 120a to face the light emitting surface 110a with respect to one side of the light emitting device 110.

Each of the plurality of optical structures 101 may include a plurality of light conversion members 130 (e.g., light wavelength converters) provided to convert the wavelength of light emitted from the light emitting device 110, and a light guide body 120 (e.g., a light guide) provided to guide light, which is emitted from the light emitting device 110, to the light conversion member 130 and/or the liquid crystal panel 10. The light guide body 120 may be formed of a material such as glass or acrylic.

The light conversion member 130 may include quantum dot particles. Quantum dot particles may be referred to as a quantum dot. The light conversion member 130 may be disposed on one surface of the light guide body 120 by patterning a resin including a plurality of quantum dots on one surface of the light guide body 120. Particularly, the light conversion member 130 may be disposed on a rear surface of the light guide body 120 and attached to the printed circuit board 90 by the adhesive layer 160. Because the plurality of light conversion members 130 form an array, the plurality of light conversion members 130 may be referred to as a light conversion pattern 130.

Particularly, as shown in FIG. 6, the light guide body 120 may include a receiving groove 120c formed to be recessed from the rear surface of the light guide body 120, and the light conversion member 130 may be inserted into the receiving groove 120c. As described above, the light conversion member 130 is inserted into the receiving groove 120c, and thus the light conversion member 130 may be protected from external heat, moisture, impact, etc. by the light guide body 120.

However, the present disclosure is not limited thereto, and as shown in FIG. 7, the rear surface of the light guide body 120 may be flat and the light conversion member 130 may be formed to be embossed from the rear surface of the light guide body 120. A space between the light conversion members 130 may be filled with the adhesive layer 160, and the light conversion members 130 may be protected from external heat, moisture, impact, etc. by the light guide body 120 and the adhesive layer 160.

The plurality of quantum dots included in the light conversion member 130 may convert a wavelength of a portion of the blue-based light emitted from the LED chip 110 into a mixture of green-based light and red-based light or into yellow-based light (wavelength shift).

The quantum dot refers, for example, to a semiconductor crystal formed by collecting hundreds to thousands of atoms. For example, the size of the quantum dot may be from several nanometers to tens of nanometers. Thus, the quantum confinement effect occurs because the quantum dots are very small in size. The quantum confinement effect refers, for example, to electrons in a particle forming a discontinuous energy state due to the outer wall of the particle when the particle is very small and as the space in the particle is smaller, the energy state of the electron becomes relatively higher and the energy band gap becomes wider. According to such a quantum confinement effect, a quantum dot may generate light in a wide range of wavelengths when light such as ultraviolet rays or visible light is incident. In this case, the quantum dot scatters incident light and emits the light.

A length of the wavelength of the light generated in the quantum dot may vary in accordance with the particle size. Particularly, when light having a wavelength greater than the energy band gap is incident on the quantum dot, the quantum dot absorbs the energy of the light and is excited, and becomes a ground state while emitting light of a specific wavelength. As the size of the quantum dots is small, the quantum dots generate light having a relatively short wavelength such as blue-based light or green-based light. As the size of the quantum dots is big, the quantum dots generate light having a relatively long wavelength such as red-based light. Therefore, it is possible to implement light of various colors according to the size of the quantum dot.

When quantum dot particles capable of converting incident light into green-based light are referred to as green quantum dot particles, and quantum dot particles capable of converting incident light into red-based light are referred to as red quantum dot particles, the plurality of quantum dots may include green quantum dots and red quantum dots.

As blue-based light collides with the green quantum dots and the red quantum dots, the blue-based light may be converted into a mixture of green-based light and red-based light or converted into yellow-based light.

The mixture of green-based light and red-based light or the yellow-based light may transmit from the light conversion member 130 and be emitted through an exit surface 120b of the light guide body 120 so as to be irradiated toward the liquid crystal panel 10.

In addition, another portion of the blue-based light emitted from the LED chip 110 may not collide with the plurality of quantum dots disposed on the light conversion member 130, and thus the blue-based light without change may be emitted through the exit surface 120b of the light guide member so as to be irradiated toward the liquid crystal panel 10.

Accordingly, white light, in which the blue-based light and the yellow-based light, in which wavelengths are converted, are mixed, may be transmitted through the light conversion member 130 and the light guide body 120 and then irradiated to the liquid crystal panel 10. Accordingly, light with improved color reproducibility may be irradiated to the liquid crystal panel 10 without an additional quantum dot sheet.

Each of the plurality of optical structures 101 may include a distributed Bragg reflector (DBR) layer 140 provided to cover the light guide body 120. Particularly, the DBR layer 140 may be disposed on the exit surface 120b of the light guide body 120 corresponding to the front surface of the light guide body 120. The DBR layer 140 may be attached to the front surface of the light guide body 120 with an adhesive.

The DBR layer 140 may include a plurality of overlapping thin films. At least two thin films among the plurality of overlapping thin films may have different refractive indices. The DBR layer 140 may improve conversion efficiency of light, which is emitted from the light emitting surface 110a and transmitted through the light guide body 120, in the light conversion member 130.

Particularly, among light emitted from the exit surface 120b of the light guide body 120, the DBR layer 140 may transmit long-wavelength light toward the liquid crystal panel 10, and reflect short-wavelength light toward the printed circuit board 90. Accordingly, the DBR layer 140 may transmit green-based light and red-based light and reflect blue-based light. However, the DBR layer 140 does not reflect all of the blue-based light, and a portion of the blue-based light may be transmitted toward the liquid crystal panel 10. The blue-based light, which is reflected by the DBR layer 140, may collide with the plurality of quantum dots included in the light conversion member 130 to be converted into red-based or green-based light, or not converted and then reflected into printed circuit board 90. The light reflected by the DBR layer 140 may be re-reflected by the PSR layer on the printed circuit board 90 and pass through the light guide member again, and then be incident on the liquid crystal panel 10. In this process, light conversion may also be performed by the light conversion member 130. A portion of the blue-based light re-reflected in the DBR layer 140 may repeat the above process. Through the above process, the light emitted from the LED chip 110 may pass through the light conversion member 130 several times, and in this process, an amount of light converted into red light or green light may increase. In other words, light conversion efficiency may be improved.

In addition, as the light emitted from the exit surface 120b passes through the plurality of thin films of the DBR layer 140, the beam angle with respect to the liquid crystal panel 10 may increase. The DBR layer 140 may improve light conversion efficiency of light, which is emitted from the light emitting surface 110a and incident on the light guide body 120, and may increase the beam angle with respect to the liquid crystal panel 10. The DBR layer 140 may include multiple layers having different refractive indices.

Figure 8:
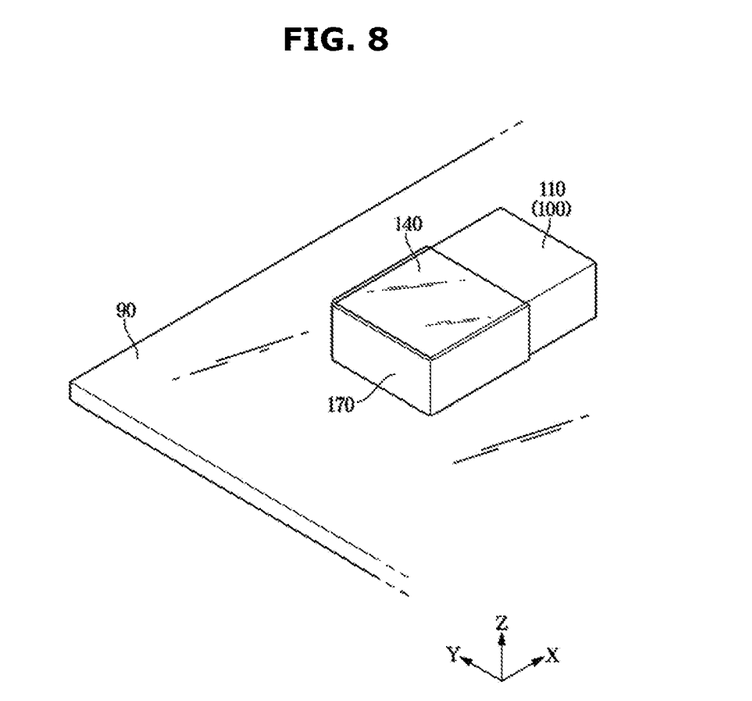
FIG. 8 is a diagram illustrating a view of a state in which an optical structure and a light emitting device are arranged in a light source module according to various embodiments.

FIG. 8 is a diagram illustrating a view of a state in which an optical structure and a light emitting device are arranged in a light source module according to various embodiments.

A light source module 100 shown in FIG. 8 may be the same as the light source module 100 shown in FIG. 4 except that the light source module 100 shown in FIG. 8 further includes a light blocking member 170. Referring to FIG. 8, the light source module 100 may include the light blocking member 170 surrounding the light guide body 120 to prevent light loss. The light blocking member 170 may cover remaining surfaces of the light guide body 120 except for front and rear surfaces and an incident surface 120a of the light guide body 120.

However, the light blocking member 170 is not limited thereto. The light blocking member 170 may be provided to surround outer circumferential surfaces of a light emitting device 110 and an optical structure 101 in a state in which the light emitting device 110 and the optical structure 101 are arranged side by side. In this case, the light blocking member 170 may surround the remaining surfaces of the light guide body 120 except for the front and rear surfaces and the incident surface 120a of the light guide body 120, and may surround remaining surfaces of the light emitting device 110 except for the front and rear surfaces and a light emitting surface 110a of the light emitting device 110.

Accordingly, light incident on the light guide body 120 may be emitted only through the exit surface 120b, thereby minimizing loss of light incident on the incident surface 120a. In order to reflect the light, which is emitted from the light guide body 120, to be incident again on the light guide body 120, the light blocking member 170 may have a white color that reflects light well. The light blocking member 170 may be formed of silicone resin, epoxy resin, or the like.

As described above, a display apparatus in a conventional manner includes a quantum dot sheet configured to convert a wavelength of light emitted from the light source in order to improve color reproducibility of light emitted from the light source, and an additional protective film is disposed with the quantum dot sheet to prevent moisture from penetrating into the quantum dot sheet. The quantum dot sheet is disposed together with the optical sheets, which causes the increase in the thickness of the display apparatus.

According to various example embodiments, the display apparatus 1 may not include the quantum dot sheet, and thus may not include an additional protective film that is disposed together with the quantum dot sheet to protect the quantum dot sheet. Accordingly, the thickness of the display apparatus, which is increased due to the arrangement of the quantum dot sheet and the additional protective film, may be reduced. That is, it is possible to make the display apparatus slim.

In addition, the light conversion member 130 is connected to the printed circuit board 90 in a heat transfer manner and thus heat, which is generated from the light conversion member 130 during light conversion by the light conversion member 130, may be dissipated through the printed circuit board 90. Therefore, the lifespan of the light conversion member 130 and the display apparatus 1 may be increased.

In addition, because the light guide body 120 and the printed circuit board 90 prevents (or reduces) the light conversion member 130 from being exposed to the outside, it is possible to prevent (or reduce) the thermal conversion caused by high heat generated in the LED chip 110. The light guide body 120 may cover the light conversion member 130 so as to protect the light conversion member 130 from direct light emitted from the light emitting device 110, and thus the lifetime of the light conversion member 130 and the display apparatus 1 may be increased.

In addition, in a conventional manner, it is required for a quantum dot sheet including quantum dots to be provided in a size corresponding to that of the printed circuit board. Therefore, when the size of the liquid crystal panel increases, the size of the quantum dot sheet increases proportionally, and accordingly, the size of the additional protective film also increases, resulting in an increase in the production cost.

As for the display apparatus 1, because the plurality of light conversion members 130 is provided to correspond to the plurality of light emitting devices 110, the light conversion member 130 may not be additionally provided in a space between the plurality of light emitting devices 110. Accordingly, an amount of use of the light conversion member including quantum dots may be significantly reduced in comparison with the quantum dot sheet. Therefore, the production cost may be reduced by reducing the amount of use of the light conversion member.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A display apparatus, comprising:
a liquid crystal panel having a display surface;
a light source plate comprising a printed circuit board (PCB) disposed behind the liquid crystal panel, and a light source module disposed on a first surface of the PCB to supply light to the liquid crystal panel,
wherein the light source module comprises:
   a light emitting diode (LED) chip having a light emitting surface perpendicular to the display surface;
   a light guide having a light incident surface facing the light emitting surface of the LED chip;
   a plurality of light converters configured to convert a wavelength of light guided through the light guide, the plurality of light converters being disposed on a first surface of the light guide perpendicular to the light incident surface and attached to the first surface of the PCB; and
   a distributed Bragg reflector (DBR) layer disposed on a second surface of the light guide opposite the first surface of the light guide.

2. The display apparatus of claim 1, wherein the plurality of light converters comprises quantum dot particles.

3. The display apparatus of claim 2, wherein the first surface comprises a rear surface of the light guide, and the second surface comprises a front surface of the light guide.

4. The display apparatus of claim 3, wherein the light source module comprises a plurality of light source modules.

5. The display apparatus of claim 3, wherein the LED chip is configured to emit blue-based light, wherein the plurality of light converters comprises a red quantum dot configured to convert blue-based light into red-based light and a green quantum dot configured to convert blue-based light into green-based light.

6. The display apparatus of claim 3, wherein the light source module further comprises a transparent resin covering the light guide, the plurality of light converters, and the DBR layer.

7. The display apparatus of claim 6, wherein the transparent resin has a dome shape.

8. The display apparatus of claim 3, wherein the plurality of light converters is embossed on the rear surface of the light guide body.

9. The display apparatus of claim 3, wherein the light guide comprises a receiving grooves on the rear surface of the light guide, and wherein the plurality of light converters is disposed in the receiving grooves.

10. The display apparatus of claim 5, wherein the light source module further comprises a light blocking member surrounding the light guide.

11. The display apparatus of claim 10, wherein the light blocking member covers surfaces of the light guide other than the front surface, the rear surface, and the light incident surface.

12. The display apparatus of claim 3, further comprising an adhesive layer disposed between the PCB and the plurality of light converters.

13. The display apparatus of claim 3, wherein heat generated in the light source module is dissipated to the PCB.

14. The display apparatus of claim 3, wherein the light guide protects the plurality of light converters from direct light emitted from the LED chip.

15. The display apparatus of claim 1, wherein the plurality of light converters comprises a quantum dot pattern.

16. The display apparatus of claim 1, wherein the plurality of light converters is disposed in an array.

17. The display apparatus of claim 1, wherein the plurality of light converters form a light conversion pattern.

* * * * *